(12) United States Patent
Wei et al.

(10) Patent No.: US 8,557,666 B2
(45) Date of Patent: Oct. 15, 2013

(54) METHODS FOR FABRICATING INTEGRATED CIRCUITS

(75) Inventors: Andy C. Wei, Dresden (DE); Peter Baars, Dresden (DE); Erik P. Geiss, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/231,750

(22) Filed: Sep. 13, 2011

(65) Prior Publication Data
US 2013/0065371 A1 Mar. 14, 2013

(51) Int. Cl.
*H01L 21/336* (2006.01)

(52) U.S. Cl.
USPC ..................... 438/294; 257/E21.09

(58) Field of Classification Search
USPC .................. 438/294; 257/E21.09, E21.409, 257/E21.546
See application file for complete search history.

(56) References Cited

U.S. PATENT DOCUMENTS

2010/0072550 A1* 3/2010 Matsuo .................. 257/347

OTHER PUBLICATIONS

German Patent Application No. 102011004506.6 filed Feb. 22, 2011.
German Patent Application No. 10 2010 029 527.2 filed May 31, 2010.
Germany Patent Application No. 102011004323.3 filed Feb. 17, 2011.

* cited by examiner

*Primary Examiner* — Tony Tran
(74) *Attorney, Agent, or Firm* — Ingrassia Fisher & Lorenz, P.C.

(57) ABSTRACT

Methods are provided for fabricating integrated circuits. One method includes etching a plurality of trenches into a silicon substrate and filling the trenches with an insulating material to delineate a plurality of spaced apart silicon fins. A layer of undoped silicon is epitaxially grown to form an upper, undoped region of the fins. Dummy gate structures are formed overlying and transverse to the plurality of fins and a back fill material fills between the dummy gate structures. The dummy gate structures are removed to expose a portion of the fins and a high-k dielectric material and a work function determining gate electrode material are deposited overlying the portion of the fins. The back fill material is removed to expose a second portion and metal silicide contacts are formed on the second portion. Conductive contacts are then formed to the work function determining material and to the metal silicide.

18 Claims, 14 Drawing Sheets

US 8,557,666 B2

METHODS FOR FABRICATING INTEGRATED CIRCUITS

TECHNICAL FIELD

The present invention generally relates to methods for fabricating integrated circuits, and more particularly relates to methods for fabricating integrated circuits having undoped channel regions and self aligned contacts.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET the transistor channel is formed at least along the vertical sidewalls of the fin, so a wide channel, and hence high performance, can be achieved without substantially increasing the area of the substrate surface required by the transistor.

Even with FINFETs, however, reducing device size and hence reducing feature size introduces fabrication problems. Such problems include adverse short channel effects as the gate length shrinks and the attendant variation in threshold voltage (basically the minimum gate voltage necessary to turn a transistor "ON") from random dopant fluctuations in the channel. Threshold variations, in turn, lead to problems with unmatched transistors. One solution is to fabricate transistors with undoped channels, but fabricating such transistors is difficult, especially with devices formed on a bulk semiconductor wafer and especially when FINFETs are intermixed in an integrated circuit with planar MOSFETs. FINFETs and planar MOSFETs have different characteristics and each possesses certain strengths. To be able to use both in a circuit design allows the circuit designer to take advantage of the strengths of each type of device.

Another problem that is encountered in the fabrication of MOSFET integrated circuits as the device size shrinks is the correct placement of contacts, for example the contacts to the source and drains of individual transistors. As the pitch (the spacing from gate to gate) decreases below a certain dimension, it is important to have a self aligning method for positioning the contacts. In order to reduce series resistance it is also important to form silicided contacts to the source and drain regions. Metal silicides must not be subjected to high temperatures, so the silicided contacts, including self aligned silicided contacts must be formed after most of the high temperature processing steps.

Accordingly, it is desirable to provide methods for fabricating integrated circuits that include both FINFETs and planar MOSFETs. In addition, it is desirable to provide methods for fabricating MOSFET integrated circuits with undoped channel regions. It is also desirable to provide methods for fabricating integrated circuits with self aligned contacts. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits, especially integrated circuits having undoped channels and self aligned contacts. One method includes etching a plurality of trenches into a silicon substrate and filling the trenches with an insulating material to delineate a plurality of spaced apart silicon fins. A layer of undoped silicon is epitaxially grown to form an upper, undoped region of the fins. Dummy gate structures are formed overlying and transverse to the plurality of fins and a back fill material fills between the dummy gate structures. The dummy gate structures are removed to expose a portion of the fins and a high-k dielectric material and a work function determining gate electrode material are deposited overlying the portion of the fins. The back fill material is removed to expose a second portion and metal silicide contacts are formed on the second portion. Conductive contacts are then formed to the work function determining material and to the metal silicide.

In accordance with a further embodiment a method for fabricating an integrated circuit includes forming a first device area and a second device area in a bulk silicon substrate, the first device area separated from the second device area by shallow trench isolation. The first device area is divided into a plurality of spaced apart silicon fins separated by a shallow trench isolation insulator. A layer of undoped channel silicon is epitaxially grown overlying portions of the first device area and the second device area and a first dummy gate is formed overlying and transverse to the fins and a second dummy gate is formed overlying the second device area. Dummy contacts are formed that are spaced apart from and adjacent the first dummy gate and the second dummy gate. The first dummy gate and the second dummy gate are removed and the shallow trench isolation insulator is etched to expose a portion of the fins. A layer of gate dielectric material and a layer of work function determining material are deposited overlying the undoped channel silicon and the dummy contacts are removed to expose portions of the fins and of the second device area. Metal silicide is formed contacting the exposed portions and electrical contacts are formed to the layer of work function material and to the metal silicide.

In accordance with yet another embodiment a method for fabricating a silicon integrated circuit includes forming shallow trench isolation to define an area of a silicon substrate. Dummy gate structures are formed overlying the area and defining a channel in the area. Sidewall spacers are formed on the dummy gate structures and spin on glass material is deposited between the dummy gate structures. The dummy gate structures are removed using the spin on glass material as an etch mask and a layer of high-k gate insulator and a capping layer are deposited overlying the channel. The spin on glass is removed to expose source and drain regions adjacent to and spaced apart from the channel. Metal silicide contacts are formed to the source and drain regions and work function determining material is deposited overlying the high-k gate insulator. Metal is deposited to contact the metal silicide contacts and the work function determining material.

BRIEF DESCRIPTION OF THE DRAWINGS

The present invention will hereinafter be described in conjunction with the following drawing figures, wherein like numerals denote like elements.

FIGS. 5 and 11 illustrate the integrated circuit in plan view; FIGS. 2-4, 6-10, and 12-20 illustrate the integrated circuit in cross sectional view.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors used in the design of ICs can be either planar MOS transistors or FINFETs, with each type of device having certain unique advantages and disadvantages. Both types of MOS transistors can be fabricated as P-channel transistors and as N-channel transistors, and both can be fabricated with or without mobility enhancing stress features. A circuit designer can mix and match device types, using P-channel and N-channel, planar MOS and FINFET, stressed and unstressed, to take advantage of the best characteristics of each device type as they best suit the circuit being designed.

Figure 1:
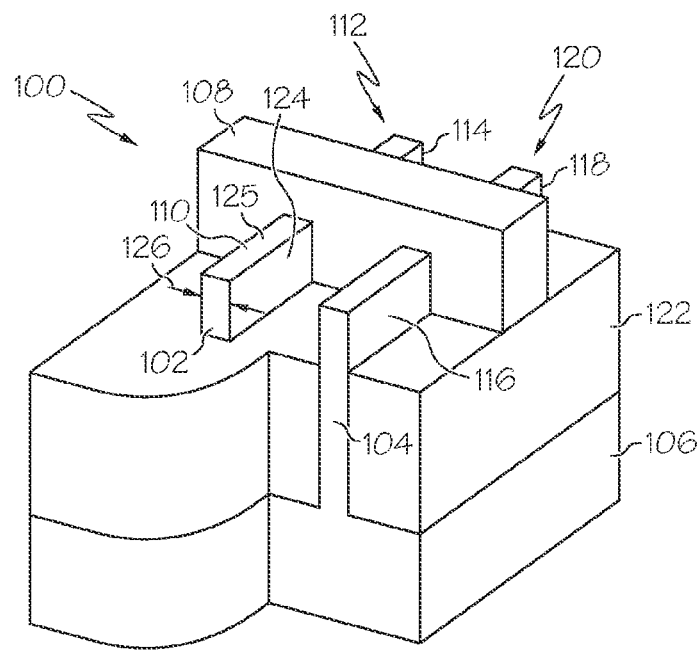
FIG. 1 illustrates a FINFET in a partially cut away perspective view.

Planar MOS transistors are well known, and so their features need not be explained. FINFETs are less well known, so the following brief explanation is provided to identify their unique features. FIG. 1 illustrates, in a cut away perspective view, a portion of a FINFET integrated circuit (IC) 100. The illustrated portion of IC 100 includes two fins 102 and 104 that are formed from and extend upwardly from a bulk semiconductor substrate 106. A gate electrode 108 overlies the two fins and is electrically insulated from the fins by a gate insulator (not illustrated). End 110 of fin 102 is appropriately impurity doped to form the source of a field effect transistor 112 and end 114 of that fin is appropriately impurity doped to form the drain of the FET. Similarly, ends 116 and 118 of fin 104 form the source and drain, respectively, of another FET 120. The illustrated portion of IC 100 thus includes two FINFETs 112 and 120 having a common gate electrode. In another configuration, if source 110 and 116 are electrically coupled together and drains 114 and 118 are electrically coupled together the structure would be a two-fin FINFET having twice the gate width of either FET 112 or 120. Oxide layer 122 forms electrical isolation between fins and between adjacent devices as is needed for the circuit being implemented. The channel of FINFET 112 extends along the sidewall 124 of fin 102 beneath gate electrode 108, along the top 125 of the fin, as well as along the opposite sidewall not visible in this perspective view. The advantage of the FINFET structure is that although the fin has only the narrow width represented by the arrows 126, the channel has a width represented by at least twice the height of the fin above oxide 122. The channel width thus can be much greater than fin width.

Figure 21:
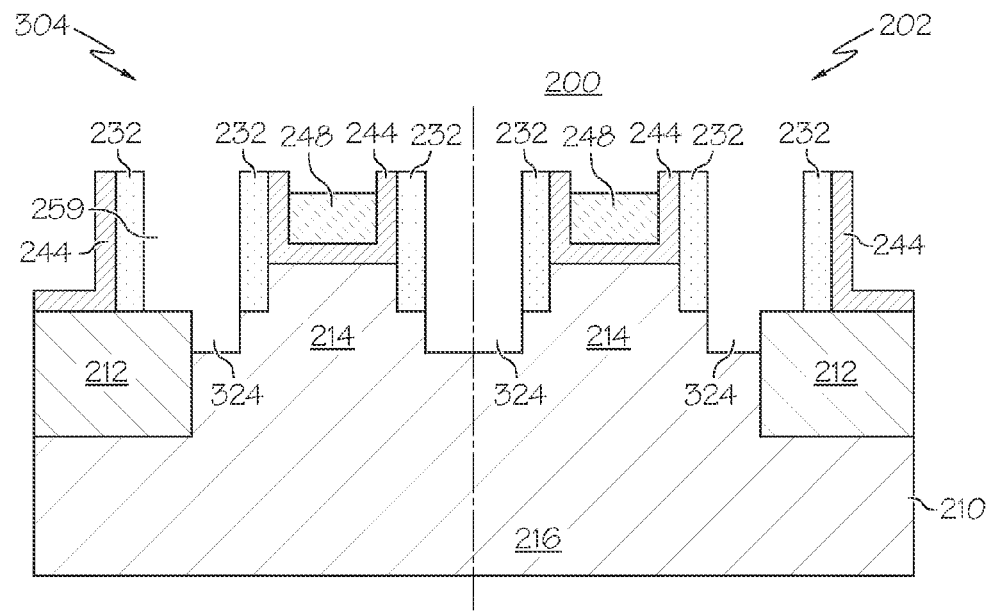
FIGS. 21-22, together with FIGS. 2, 4-11 and 12-20 illustrate, in cross sectional view methods for fabricating an integrated circuit in accordance with further embodiments.
Figure 22:
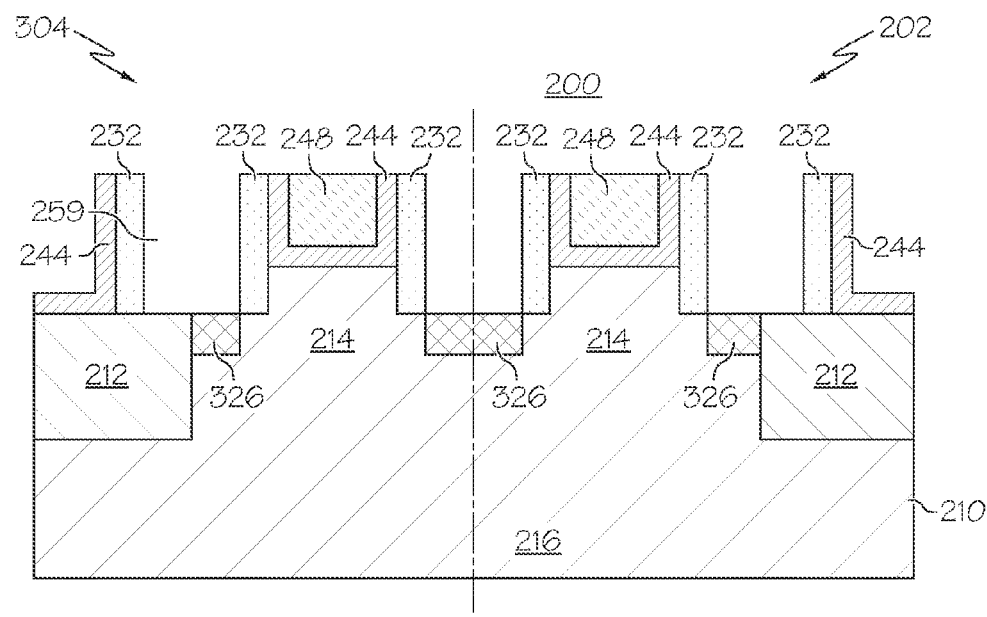

FIGS. 2-20 will illustrate methods for fabricating an integrated circuit 200 in accordance with various embodiments. FIGS. 21-22 illustrate a further embodiment, and FIGS. 23-27 illustrate yet further embodiments. The described process steps, procedures, and materials are to be considered only as exemplary embodiments designed to illustrate to one of ordinary skill in the art methods for practicing the invention; the invention is not to be limited to these exemplary embodiments. The illustrated portion of IC 200 includes only a single FINFET 202 and a single planar MOS transistor 204, although those of skill in the art will recognize that an actual IC could include a large number of such transistors. FINFET 202 is similar to FINFETs 112 and 120 described above. The initial steps described below relate specifically to the fabrication of P-channel transistors 202 and 204, but the processing steps also can be used to fabricate N-channel transistors alone or in combination with P-channel transistors. Various steps in the manufacture of ICs are well known and so, in the interest of brevity, many conventional steps will only be mentioned briefly herein or will be omitted entirely without providing the well known process details.

Figure 2:
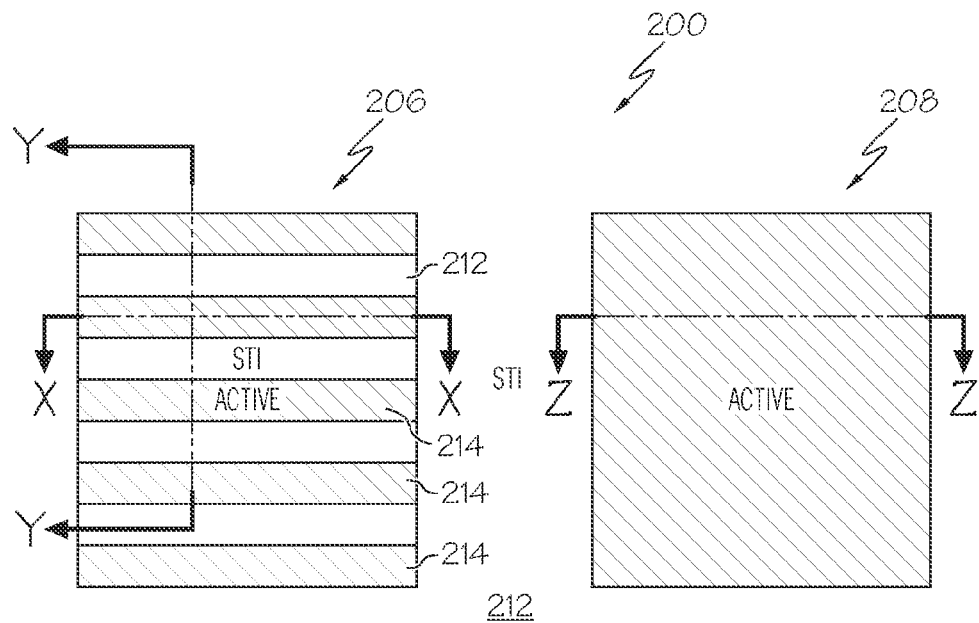
FIGS. 2-20 illustrate methods for fabricating integrated circuits in accordance with various embodiments.

FIG. 2 illustrates, in plan view, a portion of integrated circuit 200 at an early stage of fabrication. The illustrated portion includes a device area 206 in which FINFETs such as FINFET 202 will be fabricated and a device area 208 in which a planar MOS transistor such as transistor 204 will be fabricated. IC 200 is fabricated on a bulk semiconductor wafer 210 (illustrated in subsequent FIGURES). An insulating material 212 separates, delineates, and electrically isolates the two device areas. The insulating material can be, for example, part of a shallow trench isolation (STI). STI, as is well known, includes a trench that is etched into wafer 210 and is subsequently filled with an oxide or other insulating material. Insulating material 212 also extends across device area 206 to delineate a plurality of spaced apart silicon fins 214. The fins are formed by the formation of the STI, but they are not revealed at this point in the processing. The fins are revealed later as is explained below. The width and height of the fins can be adjusted based on the needs of the circuit being implemented. The fins can be, for example, about 5-50 nanometers (nm) in width and about 5-50 nm in height. Preferably the height and width are paired such that a relatively tall fin is relatively thin and a relatively short fin is wide where "tall" and "short", "thin" and "wide" are relative terms within the broad range of exemplary dimensions. This pairing of height and width allows the gates to fully deplete.

Figure 3:
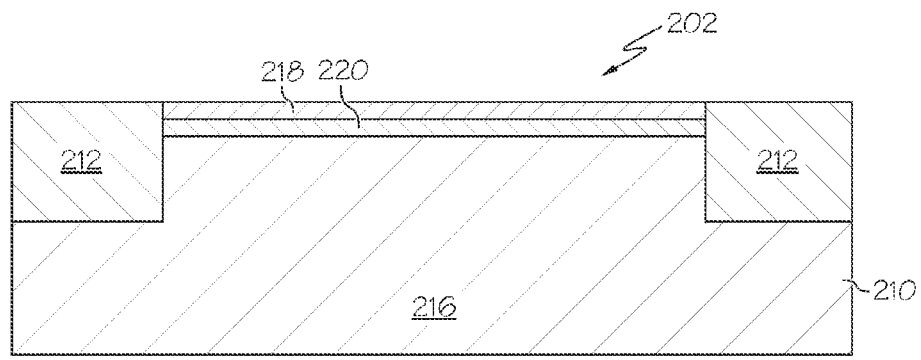

FIG. 3 schematically illustrates, in cross section taken along line X-X in FIG. 2, initial method steps in accordance with one embodiment for fabricating IC 200. FIG. 3 illustrates only a portion of device area 206 and of FINFET 202. Similar processing will also apply to device area 208 and to planar MOS transistor 204 unless otherwise noted. Following the formation of the STI 212, conductivity determining dopant impurities are implanted into bulk semiconductor wafer 210 to form a doped well 216. Bulk semiconductor wafer 210 can be silicon, silicon admixed with germanium or carbon, or other semiconductor materials commonly used in the fabrication of integrated circuits, but for simplicity will herein be referred to simply as a silicon substrate. Doped well 216 will be doped with N-type dopant impurities such as arsenic or phosphorus to fabricate a P-channel FINFET and will be doped with P-type dopant impurities such as boron to fabricate an N-channel FINFET. Areas that are not to be implanted during the well implant step can be masked, for example, with a patterned layer of photoresist. Multiple implants may be used to tailor the implant dose and dopant profile. As also illustrated in FIG. 3, an undoped epitaxial layer of channel silicon 218 is grown overlying the doped well. The undoped silicon in the channel of the transistor helps to overcome short channel effects and threshold variations across the IC. Achieving an undoped layer in conventional manner is difficult because of implant straggle and out-diffusion from the doped well during subsequent thermal processing. In accordance with one embodiment the undoped channel is successfully achieved by first epitaxially growing a layer 220 of silicon doped with carbon that is known to block the diffusion of boron and arsenic. During growth of layer 220 the reactants can be adjusted to add carbon in the amount of about 0.3% to the grown layer. A carbon doped layer having a thickness of about 10 nm is sufficient to substantially block out-diffusion from the doped well region. Undoped layer 218 is grown to a thickness at least equal to the intended height of the active fin. In the just-described embodiment the STI is formed first, then the wells are doped, and then the epitaxial layers are grown. Although not illustrated, in an alternate embodiment, alignment marks are etched in the surface of the wafer, well regions are implanted, the epitaxial layers are grown, and then the STI is formed. This embodiment has the advantage that the epitaxial layers are grown on a flat surface without pattern loading effects.

Figure 4:
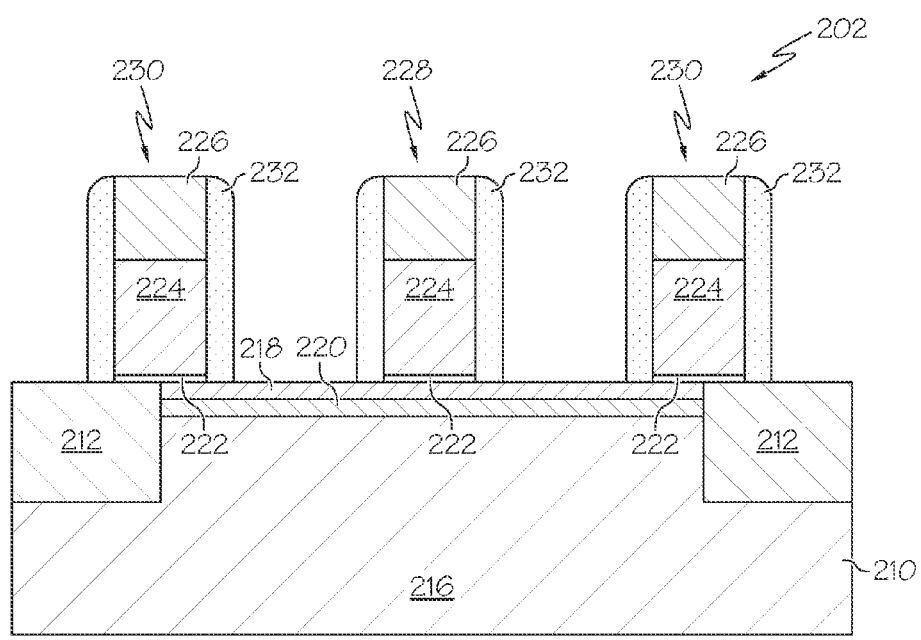
Figure 5:
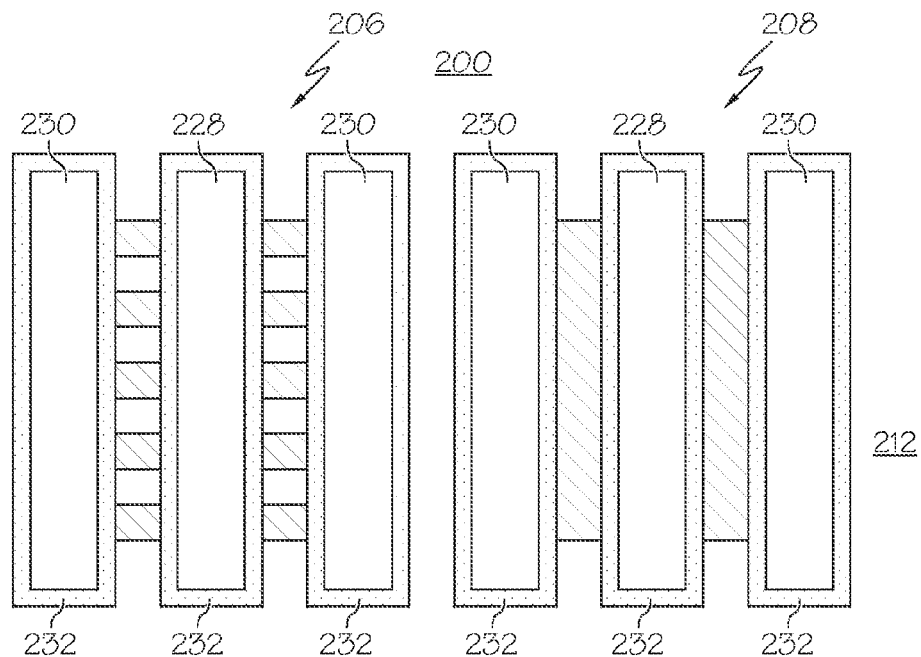

The method continues as illustrated in FIG. 4 by the deposition of a dummy gate oxide layer 222, a layer of silicon germanium (SiGe) 224, and a capping layer 226. Each of the layers can be deposited, for example, by chemical vapor deposition (CVD), low pressure chemical vapor deposition (LPCVD), or plasma enhanced chemical vapor deposition (PECVD). Layer 222 can be, for example, a layer of silicon oxide having a thickness of 1.5-2 nm, layer 224 can be a layer of amorphous silicon germanium having a thickness of 50-60 nm, and capping layer 226 can be a layer of silicon nitride having a thickness of about 40 nm. Instead of being deposited, dummy gate oxide layer 222 can be thermally grown. Layers 226, 224, and 222 are photolithographically patterned and etched to form dummy gate structures 228 and 230. After forming dummy gate structures 228 and 230, sidewall spacers 232 are formed on the sidewalls of the dummy gate structures. Similar structures are formed overlying device area 208. FIG. 5 illustrates, in plan view, IC 200 after the formation of the dummy gate structures and sidewall spacers.

Figure 6:
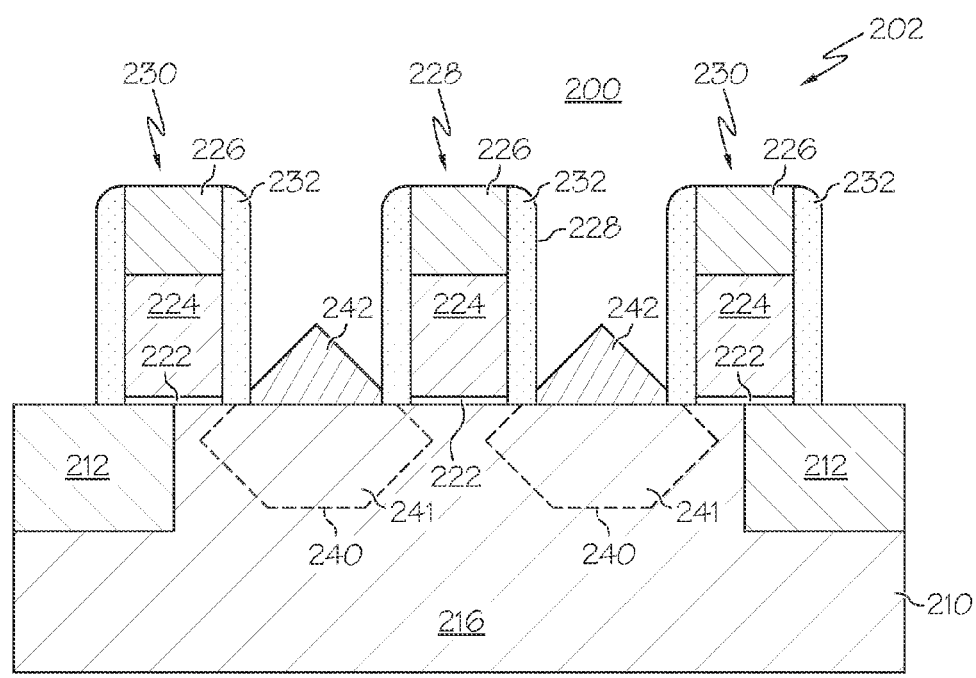

The mobility of majority carriers in the channel of an MOS transistor can be enhanced by applying a stress to the channel. A compressive longitudinal stress applied to the channel of a P-channel MOS transistor increases the mobility of holes in the channel. Similarly, a tensile longitudinal stress applied to the channel of an N-channel MOS transistor increases the mobility of electrons in the channel. A compressive stress can be applied to the channel by embedding a crystalline material having a lattice constant greater than the lattice constant of the silicon in the host well region and, correspondingly, a tensile stress can be applied by embedding a crystalline material having a smaller lattice constant. Silicon germanium is one crystalline material having a greater lattice constant than silicon and silicon carbon is one crystalline material having a smaller lattice constant than silicon. If FINFET 202 is to be fabricated with stress enhanced mobility, the method in accordance with one embodiment proceeds as illustrated in FIG. 6. Trenches 240 indicated by the dashed line are etched into well region 216 using dummy gate structures 228 and 230 and their associated sidewall spacers 232 as an etch mask. Although the trench ideally has straight vertical walls aligned with the edges of the sidewall spacers, the etchant preferentially etches more rapidly along certain crystalline planes than along other planes resulting in an irregularly shaped trench. The trench is then filled by the selective epitaxial growth of stress inducing material 241 such as SiGe for a P-channel transistor and silicon carbon for an N-channel transistor. The trench is filled with SiGe or silicon carbon that is undoped with conductivity determining impurities. In accordance with one embodiment the epitaxial growth is continued to grow silicon 242 above the original surface of epitaxial layer 218. Silicon 242 is doped with conductivity determining impurities such as boron for a P-channel transistor and phosphorus or arsenic for an N-channel transistor. This excess material eventually forms raised source and drain structures and, for the FINFET, forms impurity doped source and drain extensions. The source and drain extensions are self aligned to the dummy gate 228 and the raised portion provides additional silicon for the source and drain contacts. Again, because of the nature of the crystalline host material and the irregular shape of the trench, the resulting epitaxially grown material results in a non-planar upper surface. The same embedding of a stress inducing material can be carried out on planar MOS transistor 204.

In the structure illustrated, dummy gate structure 228 serves as a place holder for an active gate that is to be formed by a replacement gate process as described below. Dummy gate structures 230 are known as STI tuck-under dummy gates. They will be replaced by tiling gates in the final device structure. Tiling gates serve to establish a substantially uniform density of features across the IC which aids in obtaining uniform processing such as during planarization steps. The tuck-under dummy gates help to provide uniform etching of trenches 240 at the well-STI boundary. In the absence of these dummy gates, faceting of the grown embedded material might or might not occur, depending upon alignment, resulting in variations in the applied stress which, in turn, results in variations in mobility and hence in drive current.

Although not illustrated in any of the FIGURES to avoid confusing the drawings, source and drain regions are formed in the conventional manner by the implantation of conductivity determining ions. For example, on the planar transistor source and drain extensions and halo regions can be implanted before the formation of sidewall spacers 232. Deep source and drain regions can be implanted into and through the stress inducing material 242. The P-channel source and drains can be formed by implanting boron ions. The N-channel source and drains can be formed by implanting arsenic or phosphorus ions. The ions are implanted into the fins and into the planar MOS transistor using the dummy gate structures as ion implantation masks so as to self align the source and drain regions to the gate and underlying channel. In the FINFET, source and drain regions can be formed by ion implantation only in FINFETS having relatively short fins because of the limited range of implanted ions. On relatively tall fins the source and drain extensions are provided by the doped portion of the embedded epitaxial layers with the raised portions forming extra source and drain to contact.

Figure 7:
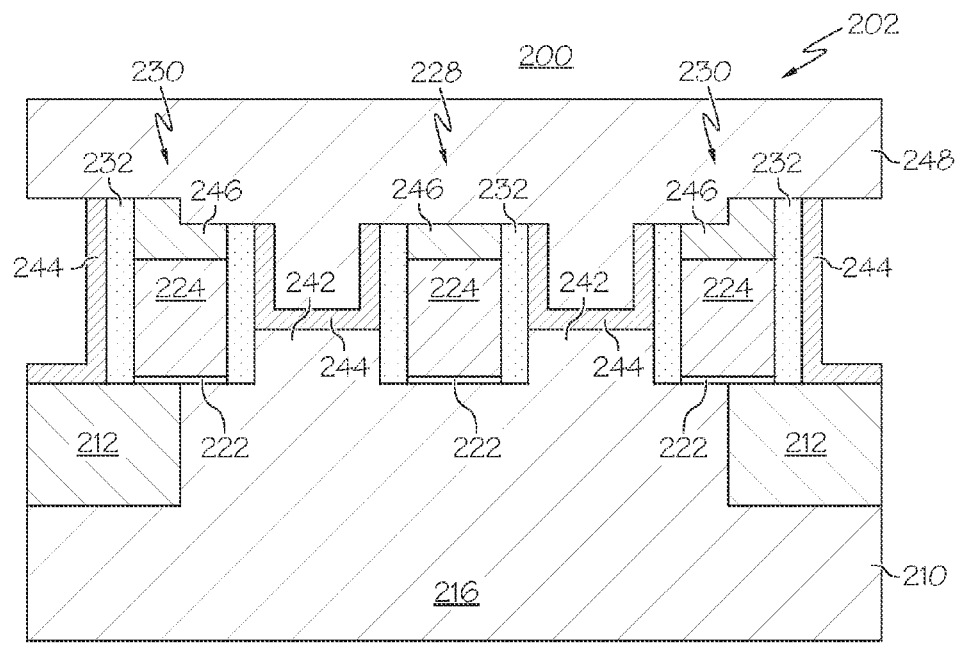

The method for fabricating IC 200 proceeds as illustrated in FIG. 7. A layer of etch stop material 244 is deposited overlying the dummy gate structures and raised source and drain regions. The layer of etch stop material can be, for example, a thin layer of silicon nitride having a thickness of about 4-5 nm that is deposited by plasma enhanced atomic layer deposition (PEALD). For ease of illustration this and the following FIGURES are simplified by showing the raised source and drain regions as flat and not irregularly shaped. The layer of etch stop material is polished back, for example by CMP, and a top portion of cap layer 226 is removed. A layer of amorphous silicon 246 is deposited over the etch stop material and the remaining cap layer. The amorphous silicon back fills the space between sidewall spacers 232 on the sidewalls of dummy gate structures 228 and 230.

Figure 8:
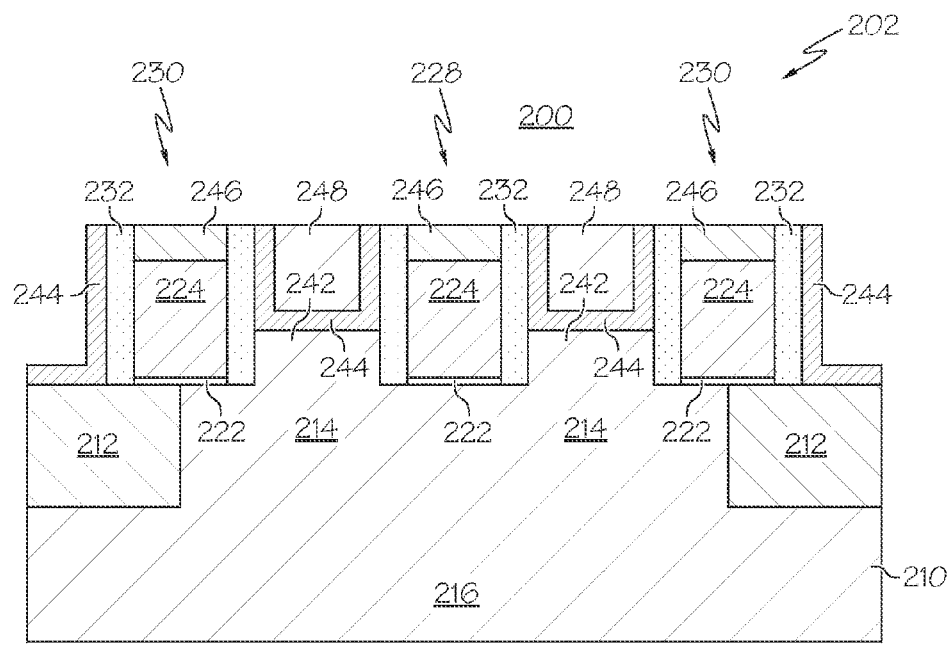

The layer of amorphous silicon is planarized, for example by CMP, with the planarization stopping on the remaining portion of cap layer 246 as illustrated in FIG. 8. The remaining amorphous silicon 248 serves as a self aligned dummy contact or as a dummy back fill, self aligned and spaced apart from the dummy gate structure. Using two different dummy structures, formed as has been explained, self aligned to each other, allows the formation of source and drain contacts self aligned to gates. In this embodiment silicon germanium has been selected for the material of dummy gate structures 228 and 230 and silicon has been selected for the material of dummy back fill 248 because the two have different etch characteristics. Other materials having such different etch characteristics could also be selected.

Figure 9:
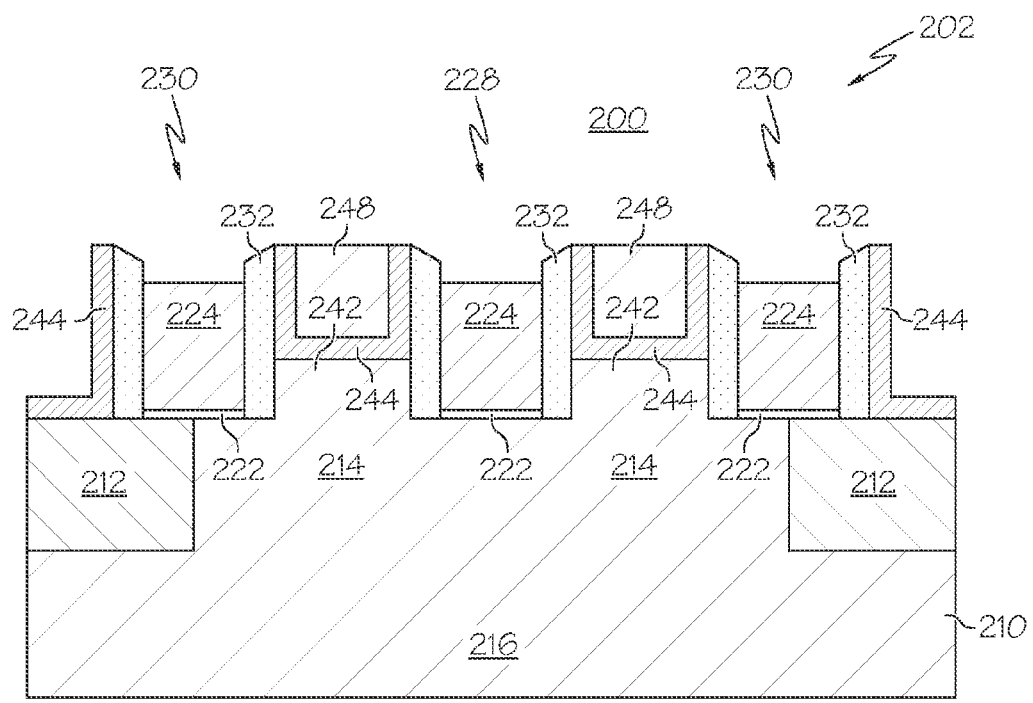
Figure 10:
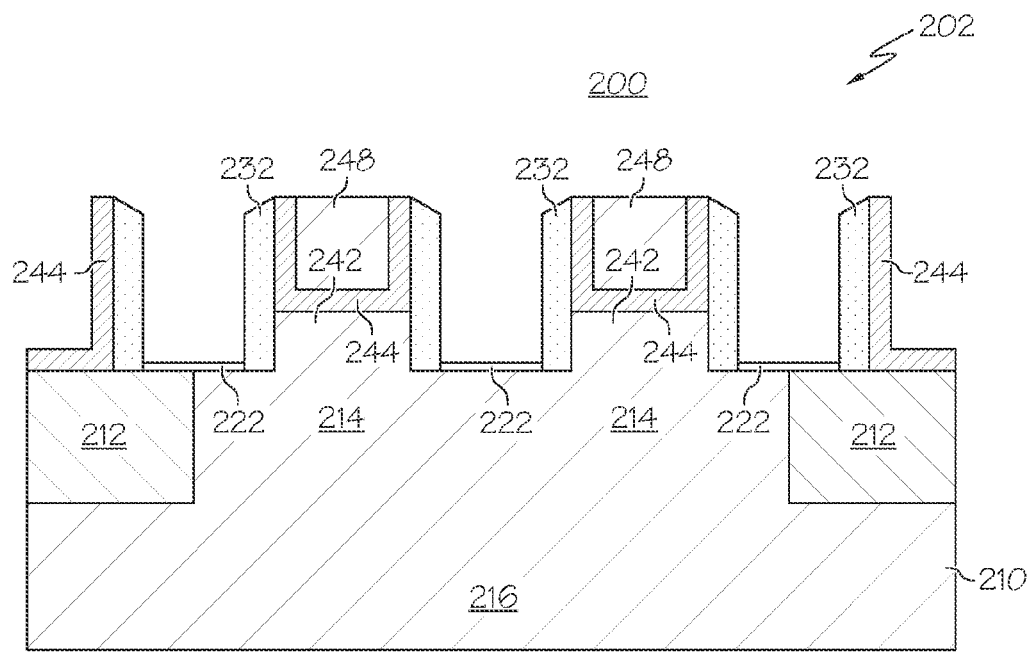
Figure 11:
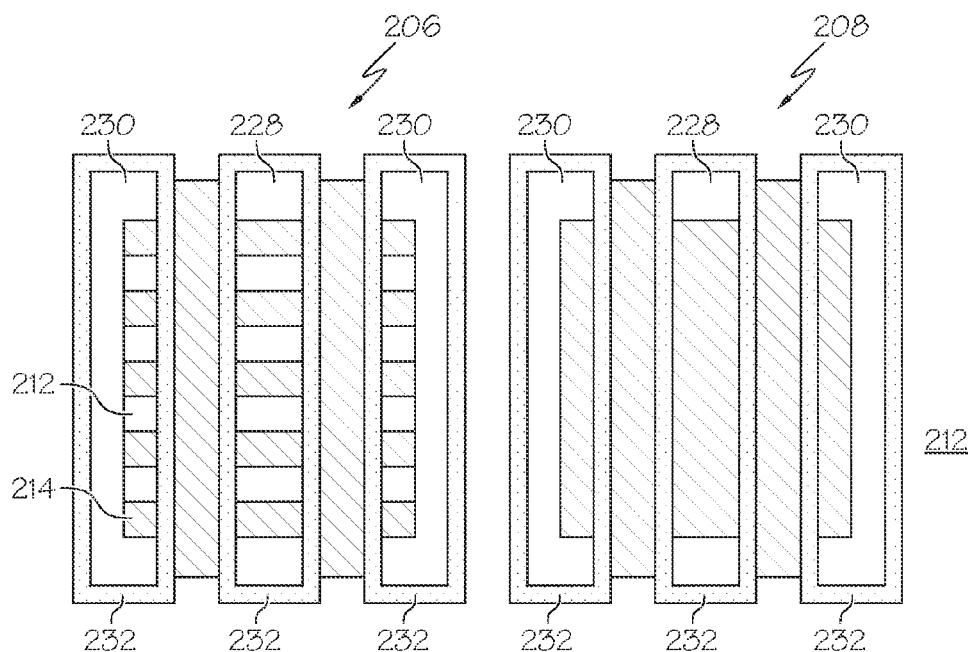

The method for fabricating integrated circuit 200 continues by removing the remaining portion of cap layer 226 to expose amorphous silicon germanium 224 of dummy gate structures 228 and 230 as illustrated in FIG. 9. The cap layer is removed in an etchant that is selective and does not etch the silicon or silicon germanium. The amorphous silicon germanium can then be removed as indicated in cross section in FIG. 10 and as illustrated in plan view in FIG. 11. Silicon germanium can be etched in a mixture of ammonium hydroxide and hydrogen peroxide. This etchant removes silicon germanium but does not etch silicon.

Figure 12:
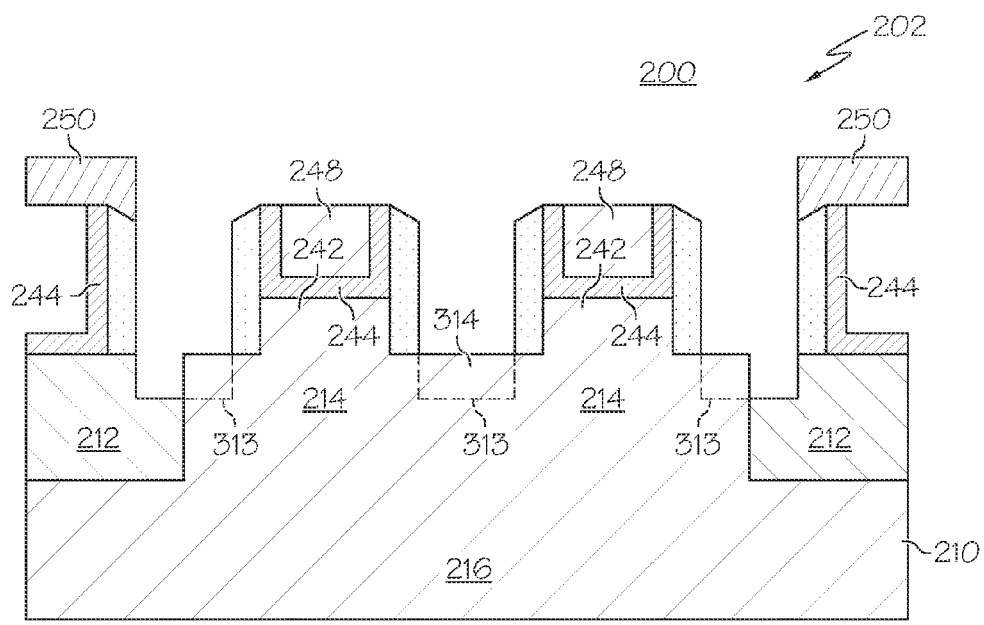
Figure 13:
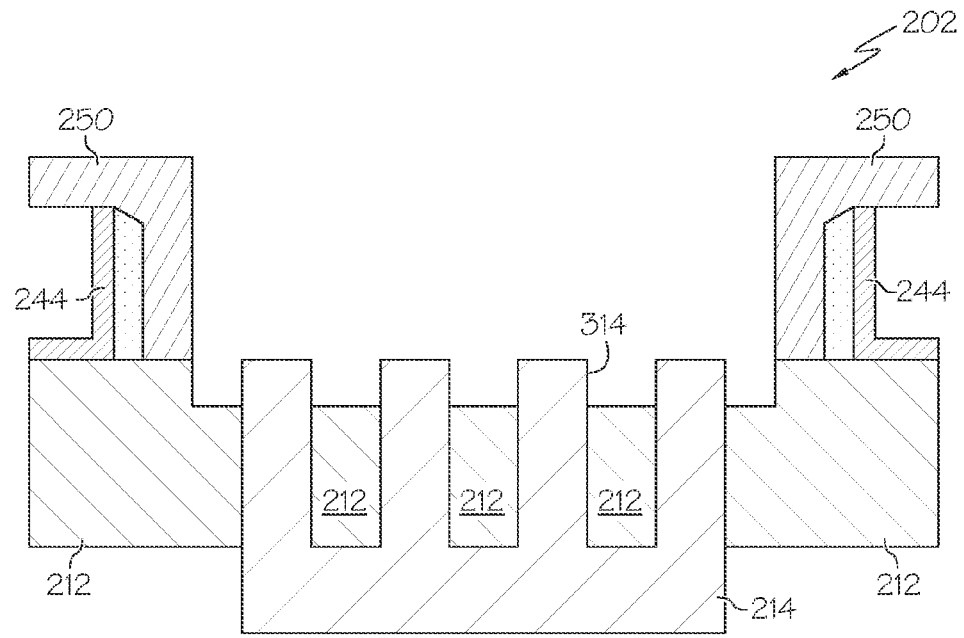

The method in accordance with one embodiment continues as illustrated in FIGS. 12 and 13. FIG. 13 is a cross sectional view taken along the line Y-Y in FIG. 2. A photoresist mask layer 250 is applied and patterned to protect planar device area 208 while exposing FINFET device area 206. With mask layer 250 in place, STI insulation layer 212 is etched back around fins 214 to reveal a top portion 314 of the fins indicated by the dotted lines 313 in FIG. 12. In this embodiment the exposed top portion 314, the gate wrap-around, corresponds to the undoped epitaxial layer 218. The undoped channel of the FINFET will be formed in this gate wrap-around area. Although formed early in the fabrication of the IC, the fins are not revealed until late in the processing by the etching of STI 212. Late revealing to the fins is possible because dummy contact structures 248 are in place after the removal of dummy gate structures 228 and 230. Revealing the fins only at this late stage in the processing has allowed all the prior processing steps to be carried out on a substantially planar upper surface of the semiconductor wafer. If the fins are revealed early, as is conventional, processing must be done in three dimensions which is much more difficult.

Figure 14:
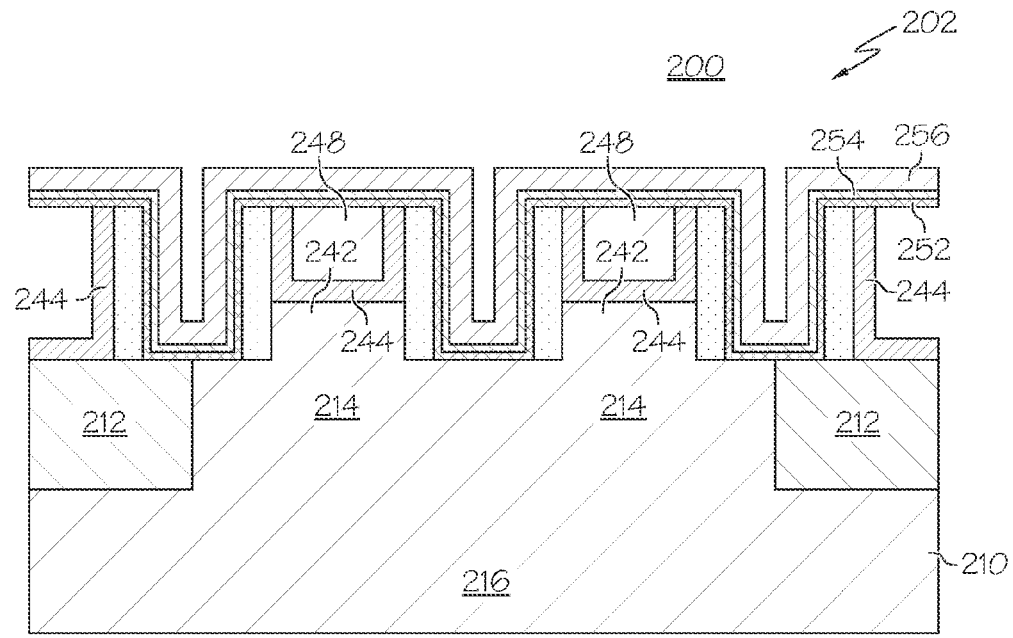

As illustrated in FIG. 14 the method continues by removing patterned photoresist layer 250, cleaning the exposed surface of the fins, and depositing a high dielectric constant (high-k) gate insulator layer 252, a cap layer of, for example, TiN 254, and a layer of work function determining material 256. For ease of illustration this and following FIGURES have been simplified by omitting the gate wrap-around. For a P-channel MOS transistor the work function determining material 256 can be, for example, titanium nitride. A different work function determining material such as titanium aluminum nitride will be used on the N-channel MOS transistors.

Figure 15:
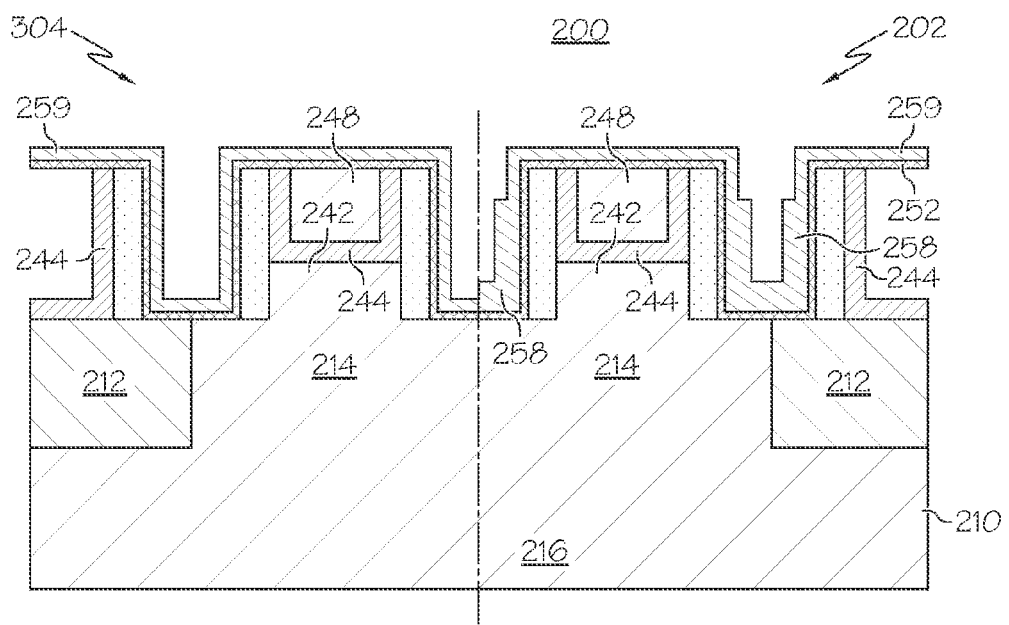

FIGS. 15-20 illustrate continuing steps in the fabrication of IC 200. In these FIGURES, still showing a cross sectional view through a fin 214 along line X-X in FIG. 2, steps in the fabrication of an N-channel FINFET 304 are illustrated on the left and steps in the fabrication of a P-channel FINFET 202 are illustrated on the right. As illustrated in FIG. 15, the TiN is removed from the N-channel FINFET and the work function determining material 256 is etched back on the P-channel FINFET. In accordance with one embodiment the removal of TiN from the N-channel FINFET can be accomplished by forming a patterned masking layer (not illustrated) such as a patterned layer of spin on glass overlying the P-channel FINFET followed by etching the TiN. The layer of spin on glass can then be etched back to leave a portion of reduced thickness only in the gate areas that were vacated by the earlier removal of the amorphous silicon germanium. The reduced thickness of spin on glass is then used as an etch mask to remove any work function determining material 256 except that in the P-channel gate areas, now labeled 258. A layer of work function determining material 259 such as TiAlN is deposited overlying the N-channel FINFET 304.

Figure 16:
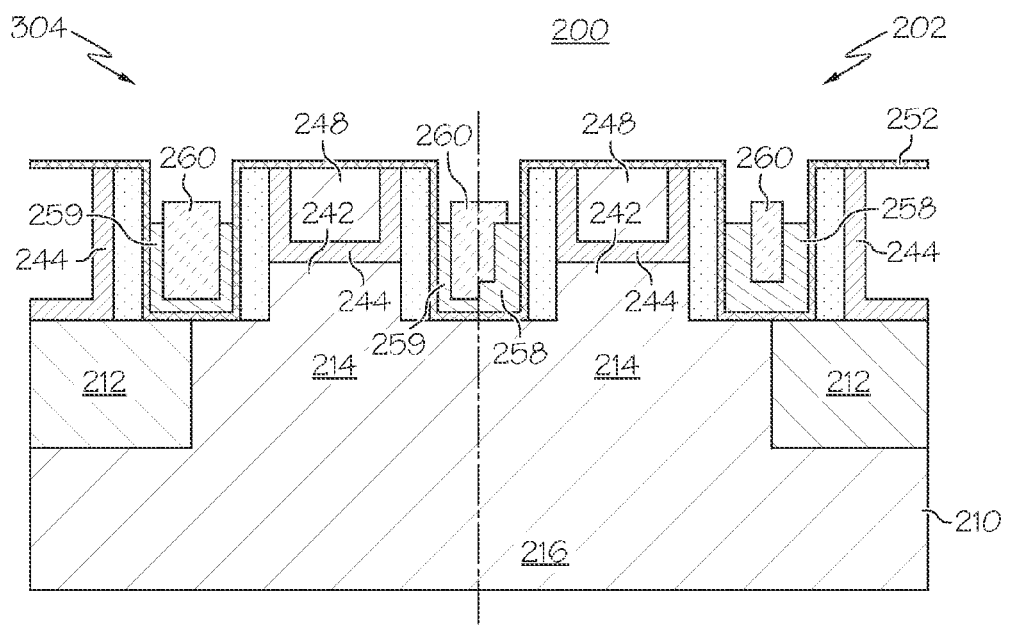

As illustrated in FIG. 16 a layer of spin on glass is applied and etched back to leave spin on glass 260 only in the gate areas. The spin on glass is used as an etch mask and the work function metal outside the gate areas is removed. An etchant such as hydrogen peroxide etches the work function determining material but stops on the high-k dielectric material 252.

Figure 17:
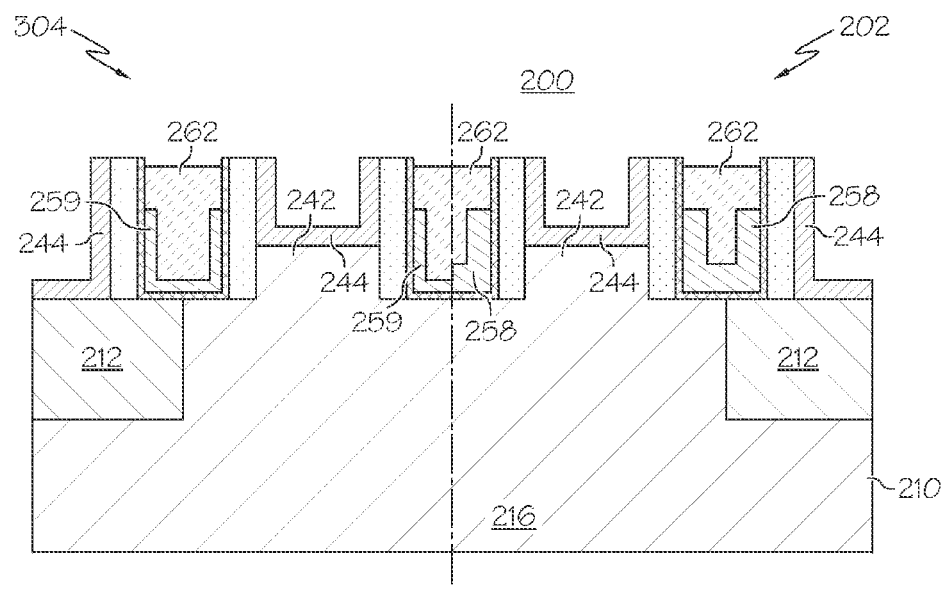

In accordance with one embodiment additional spin on glass is applied and etched back to the high-k dielectric layer 252. The exposed portions of the high-k dielectric layer are etched, for example in a BCl$_3$ etchant. The remaining portion 262 of spin on glass is used as an etch mask and dummy back fill silicon 248 is removed from the source and drain contact areas as illustrated in FIG. 17.

Figure 18:
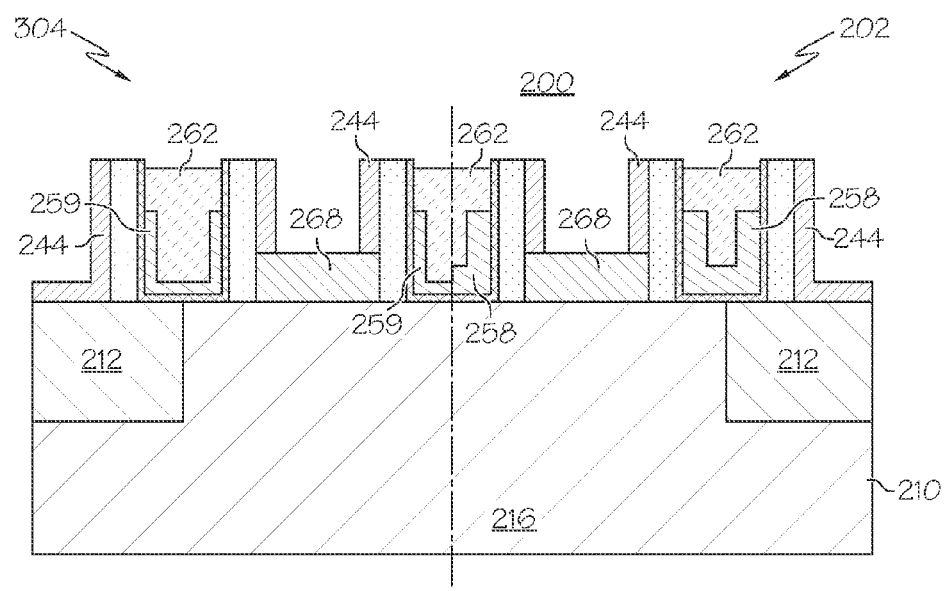

The method for fabricating IC 200 continues as illustrated in FIG. 18 by removing the thin etch stop layer 244 from the bottom of the contact areas. The etch stop layer can be removed, for example, by an anisotropic etchant, leaving the etch stop layer along sidewalls 232. After cleaning the surface of the exposed silicon in the contact areas, a layer of silicide forming metal such as nickel is deposited and annealed to react the metal with silicon to form metal silicide contacts 268 to the source and drain regions. The annealing temperature used to form the silicide is lower than temperatures encountered in previous processing steps. It is advantageous to form the silicide at a late stage in the processing to avoid deleterious effects on the silicide that would result from the higher processing temperatures. The silicide forming metal that is not in contact with silicon does not react and can be removed, for example in a wet acid etchant. Following the removal of the unreacted metal, the spin on glass 262 is also removed selective to other oxide material present on the substrate. Glass 262 can be removed by first oxidizing the glass to form a poor quality oxide which etches selectively to better quality oxides.

Figure 19:
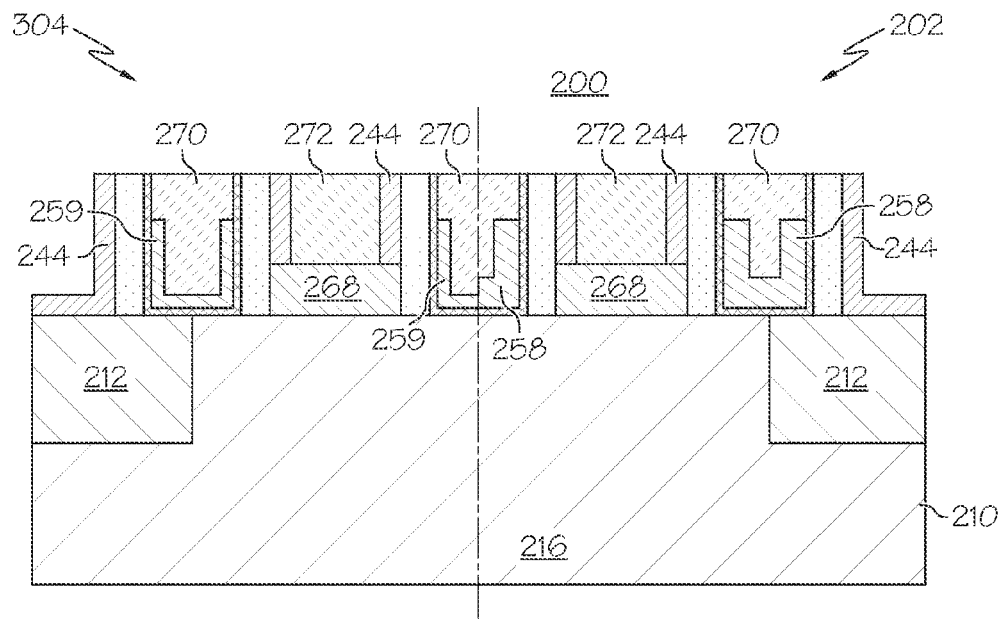

A metal gate electrode 270 contacting work function determining metals 258 and 259 and source and drain contacts 272 contacting the metal silicide contacts 268 are formed as illustrated in FIG. 19. A titanium wetting layer (not illustrated)

may first be deposited followed by a layer of, for example, aluminum admixed with a small amount of germanium. Adding 1-2% of germanium to the aluminum reduces the melting point of the alloy significantly, allowing the alloy to be reflowed into small recesses. The aluminum is planarized, for example by CMP. The sequential removal of first dummy gate structures 228 and 230 and then the removal of dummy contact structures 248, the latter made possible by the use of the spin on glass, allows the gate and contacts to be metallized at the same time and with the same material.

Figure 20:
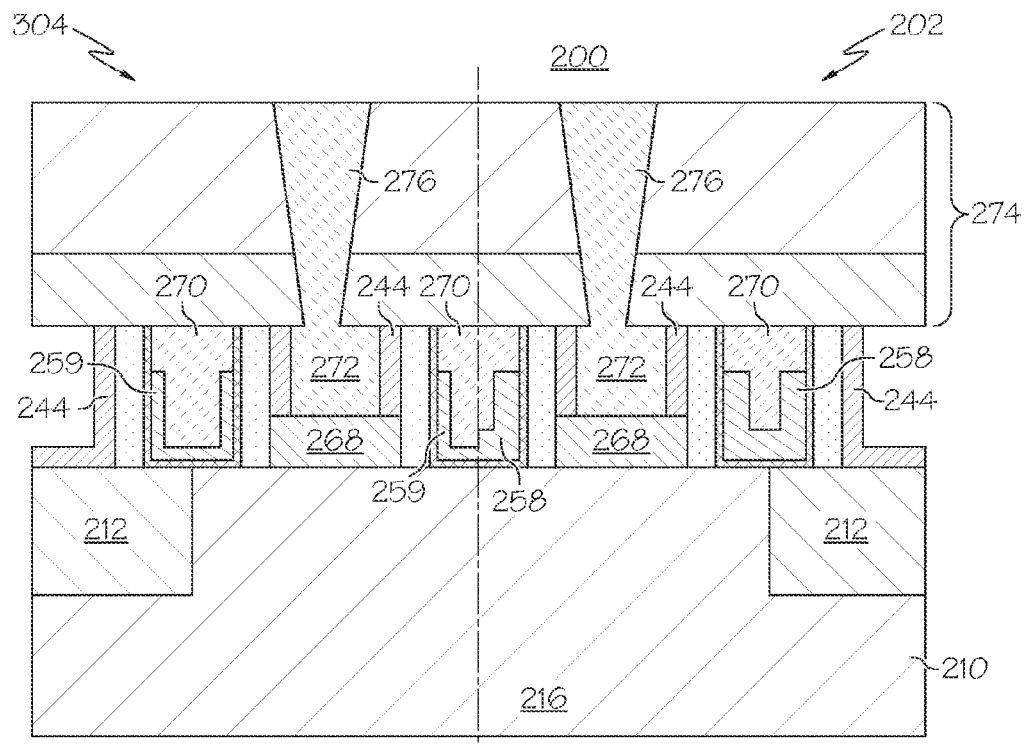

An inter-layer dielectric (ILD) 274 is deposited overlying metal gate electrode 270 and source and drain contacts 272 as illustrated in FIG. 20. The ILD can be a deposited oxide, nitride, other insulating material, or combinations of insulating materials. The top surface of ILD 274 is planarized and vias are etched through the ILD to expose portions of the source and drain contacts. Metal plugs 276 are formed in the vias in conventional manner as is interconnect metallization and other back end of line processing.

In accordance with an alternate embodiment the carbon doped and undoped epitaxial layers described and illustrated in FIG. 3 are not formed. Instead, after the doping of well regions 216 the method proceeds as illustrated in FIGS. 4-11. After removing the silicon germanium dummy gate electrode structure 224 and the dummy gate oxide 222, the exposed silicon in the gate areas is etched to form a trench 324 as illustrated in FIG. 21. An undoped silicon channel region 326 is grown in trench 324 by a process of selective epitaxial growth of undoped silicon as illustrated in FIG. 22.

Following the growth of undoped silicon channel 326, the method proceeds in the same manner as in FIGS. 12-20. The first of these steps, as illustrated in FIG. 12, is to etch the STI insulator to expose a top portion of fins 214 including the undoped silicon channel region 326. The planar transistor is protected by an etch mask during this etch step.

Figure 23:
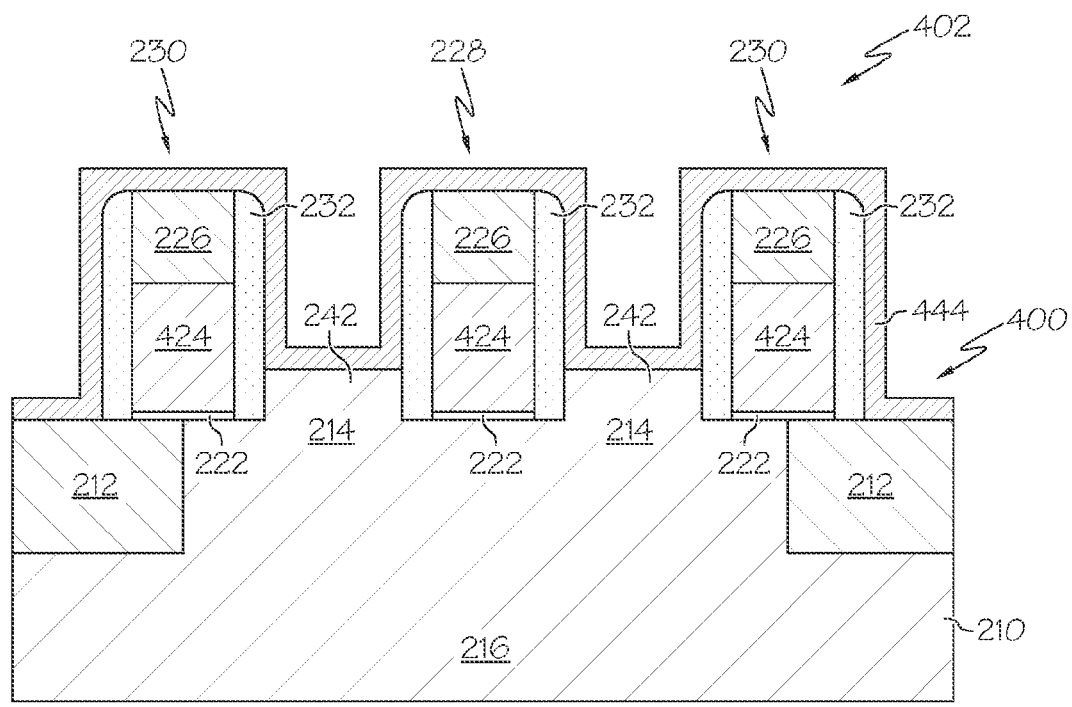
FIGS. 23-27 illustrate, in cross sectional view, methods for fabricating an integrated circuit in accordance with yet further embodiments.

FIGS. 23-27 illustrate yet a further alternate embodiment for fabricating an integrated circuit 400, this embodiment is particularly applicable to the fabrication of planar MOS transistors. FIGS. 23-27 illustrate, in a cross sectional view taken along the line Z-Z in FIG. 2, a single planar transistor 402 of IC 400. Many details of this embodiment are similar to the embodiments described above, so those details will be described only briefly. Similar features will be numbered as above. As illustrated in FIG. 23, planar transistor 402 is formed in a device region 208 in a silicon substrate 210. Device region 208 is isolated by shallow trench isolation 212 or other electrical isolation. A well region 216 is formed in the silicon substrate by ion implantation. Dummy gate structures 228 and 230 are formed overlying the well region. Raised source and drain structures are formed between the dummy gate structures. The raised source and drain structures can be formed of a strain inducing material such as silicon germanium or silicon carbon if needed to implement the IC being fabricated. The dummy gate structure includes a dummy gate insulator 222, a capping layer 226 such as a silicon nitride capping layer, and a polycrystalline silicon dummy gate electrode 424. The dummy gate electrode is polycrystalline silicon in contrast to the silicon germanium dummy gate electrode of previously described embodiments. A thin etch stop layer 444 such as a layer of silicon nitride having a thickness of about 8 nm is deposited to cover the dummy gate structures and the raised source and drain structures.

Figure 24:
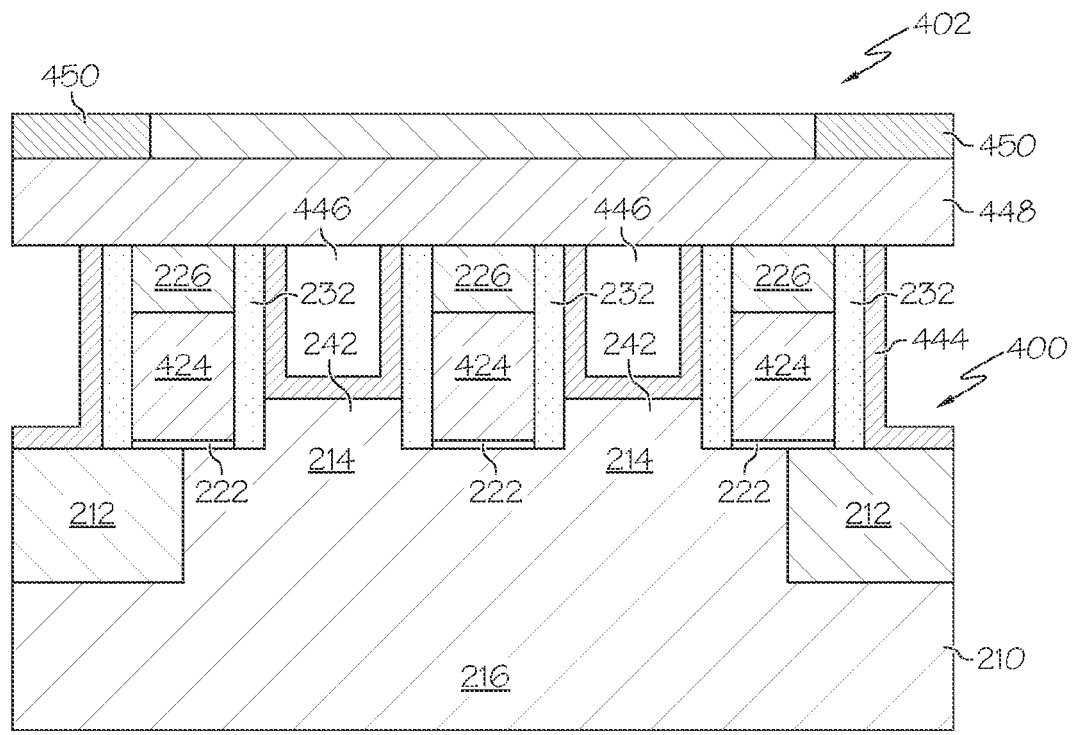

A layer of oxide is deposited and planarized to form oxide plugs 446 filling the spaces between the dummy gate structures and to remove a portion of etch stop layer 444 overlying capping layer 226. Another layer of oxide 448, such as a layer of TEOS (tetraethyl orthosilicate) oxide is deposited overlying the oxide plugs. A layer of photoresist 450 is applied and patterned overlying the layer of oxide as illustrated in FIG. 24.

Figure 25:
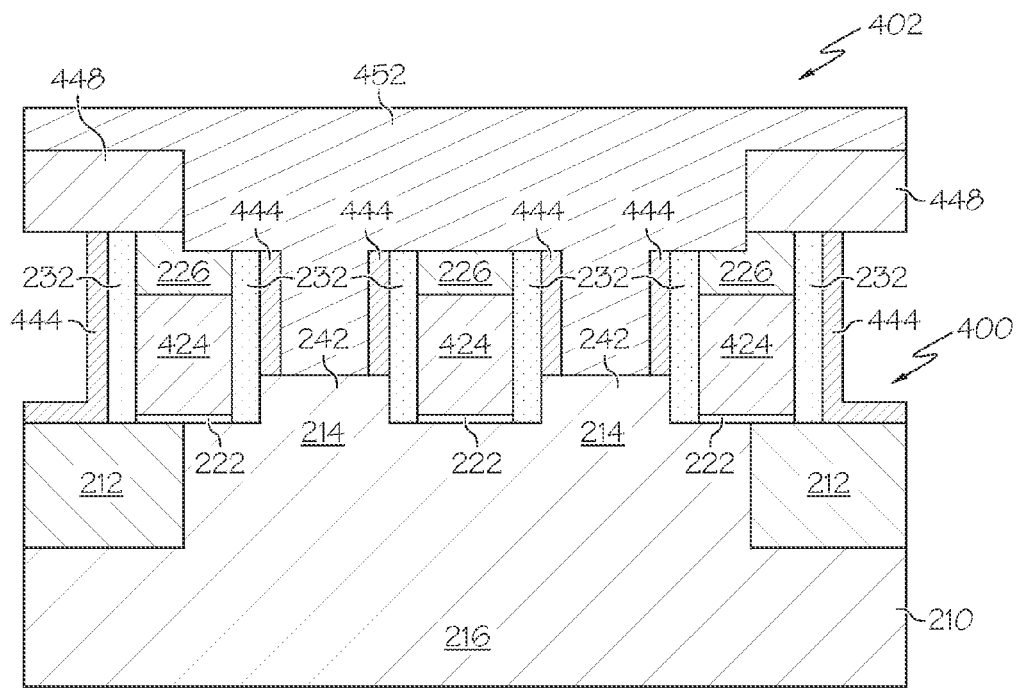

The patterned layer of photoresist is used as an etch mask and the layer of oxide 448 is patterned, a portion of caps 226 is thinned, a portion of etch stop layer 444 is removed, and oxide plugs 446 are removed as illustrated in FIG. 25. The layer of patterned photoresist is then removed and a layer of spin on glass 452 is deposited and cured overlying the etched structure and filling the space between the dummy gate structures.

Figure 26:
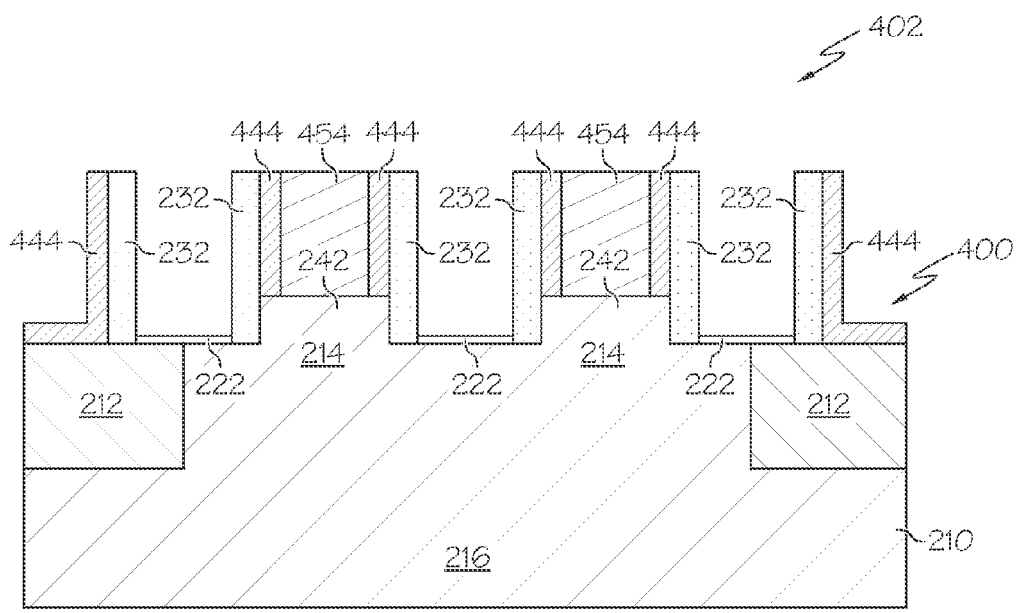

As illustrated in FIG. 26, the layer of spin on glass is polished, for example by CMP. The polishing continues until caps 226 are removed, exposing the polycrystalline silicon dummy gate electrodes 424. A portion 454 of the spin on glass remains between the dummy gate structures. The polycrystalline silicon is removed by a silicon etchant. The portion of the spin on glass remaining between the dummy gate structures protects the raised source and drain structures 242 from the etchant.

Figure 27:
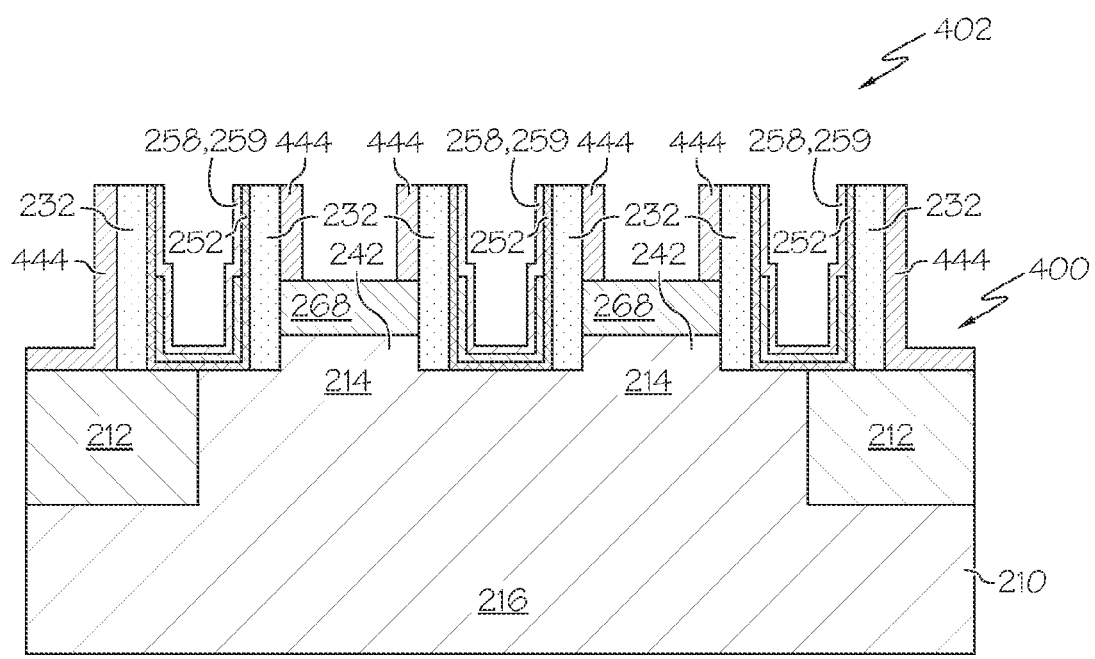

The method in accordance with this embodiment proceeds with depositing a high-k dielectric gate insulator and work function determining materials in the same manner as illustrated in FIGS. 14-17 except that in this embodiment the source and drain structures are protected by a spin on glass rather than by polycrystalline silicon 248. After forming the gate insulator and work function determining material layers, the spin on glass material 454 is removed to expose source and drain regions adjacent to and self aligned with the channel. Metal silicide contacts 268 are formed as illustrated in FIG. 27 in the same manner as described above in discussing FIG. 18. FIG. 27 is the same as FIG. 18 except that FIG. 27 does not illustrate both an N-channel and a P-channel MOS transistor. As illustrated, at this point in the fabrication, transistor 402 includes a high-k gate dielectric 252, a work function determining metal 258 or 259, and metal silicide contacts 268 self aligned to and spaced apart from a gate region. Thereafter the method proceeds in the same manner as illustrated in FIGS. 19-20. The source and drain contacts are formed of a metal silicide that is self aligned to the gate electrodes and, because formed late in the process, are compatible with a high-k gate dielectric/metal gate structure.

While several exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:

etching trenches into a silicon substrate and filling the trenches with an insulating material to separate spaced apart silicon fins having top surfaces and sidewalls;

forming dummy gate structures overlying and transverse to the fins, the dummy gate structures overlying first regions of the fins;

filling between the dummy gate structures with a back fill material, the back fill material overlying second regions of the fins;

removing the dummy gate structures to expose the top surfaces of the first regions of the fins;
etching the insulating material to expose the sidewalls of the first regions of the fins;
depositing a high-k dielectric material and a work function determining gate electrode material overlying the top surfaces and sidewalls of the first regions of the fins;
removing the back fill material to expose the top surfaces of the fins in the second regions;
forming metal silicide contacts on the top surfaces of the second regions of the fins;
forming conductive contacts to the work function determining material and to the metal silicide contacts;
etching the top surfaces of the first regions of the fins exposed by removing the dummy gate structures to form recesses; and
epitaxially growing a layer of undoped silicon to fill the recesses.

2. The method of claim 1 further comprising epitaxially growing a layer of undoped silicon over the top surfaces of the fins.

3. The method of claim 1 further comprising providing a bulk silicon substrate, wherein etching trenches into a silicon substrate comprises etching trenches into the bulk silicon substrate.

4. The method of claim 1 wherein removing the back fill material comprises:
depositing a layer of spin on glass;
planarizing the layer of spin on glass to leave a portion of the spin on glass overlying the work function determining gate electrode material; and
etching the back fill material using the spin on glass as an etch mask.

5. The method of claim 1 wherein forming metal silicide contacts comprises forming nickel silicide contacts and wherein forming conductive contacts comprises depositing and planarizing a metal on both the metal silicide contacts and on the work function determining gate electrode material.

6. The method of claim 1 further comprising epitaxially growing a layer of undoped silicon on the top surfaces of the fins to form undoped regions of the fins before filling between the dummy gate structures with a back fill material.

7. The method of claim 1 further comprising epitaxially growing a layer of undoped silicon on the top surfaces of the fins to form undoped regions of the fins before removing the dummy gate structures.

8. The method of claim 1 wherein removing the back fill material comprises removing the back fill material after depositing a high-k dielectric material and a work function determining gate electrode material.

9. The method of claim 1 wherein forming dummy gate structures overlying and transverse to the fins comprises:
forming dummy gate layers overlying the fins; and
patterning the dummy gate layers to form dummy gate stacks.

10. A method for fabricating an integrated circuit comprising:
etching a plurality of trenches into a silicon substrate and filling the trenches with an insulating material to delineate a plurality of spaced apart silicon fins;
epitaxially growing a layer of undoped silicon to form an upper, undoped region of the fins;
forming dummy gate structures overlying and transverse to the plurality of fins;
filling between the dummy gate structures with a back fill material;
removing the dummy gate structures to expose a portion of the fins;
depositing a high-k dielectric material and a work function determining gate electrode material overlying the portion of the fins;
removing the back fill material to expose a second portion of the fins;
forming metal silicide contacts on the second portion of the fins; and
forming conductive contacts to the work function determining material and to the metal silicide, wherein forming dummy gate structures comprises:
forming a layer of insulator overlying the fins;
depositing a layer of silicon germanium overlying the layer of insulator;
depositing a layer of hard mask material overlying the layer of silicon germanium;
patterning the layer of hard mask material, layer of silicon germanium, and layer of insulator to form dummy gate stacks; and
forming sidewall spacers on the dummy gate stacks.

11. The method of claim 10 further comprising:
etching trenches into the plurality of fins using the dummy gate stacks and sidewall spacers as an etch mask;
filling the trenches by a process of selective epitaxial growth of a material selected from the group consisting of silicon germanium and silicon carbon.

12. The method of claim 10 wherein filling between dummy gate structures comprises:
depositing silicon between adjacent ones of the plurality of dummy gate structures; and
planarizing the silicon by chemical mechanical planarization.

13. A method for fabricating an integrated circuit comprising:
etching trenches into a semiconductor substrate to define sidewalls of spaced apart semiconductor fins having top surfaces;
filling the trenches with an insulating material such that the insulating material is planar with the top surfaces of the fins;
forming dummy gate structures overlying the insulating material and first regions of the fins, wherein second regions of the fins are defined between the dummy gate structures;
covering the second regions of the fins with a fill material;
removing the dummy gate structures to expose the top surfaces of the first regions of the fins;
etching the insulating material to expose the sidewalls of the first regions of the fins;
forming a gate structure overlying the top surfaces and sidewalls of the first regions of the fins;
removing the fill material to expose the top surfaces of the fins in the second regions;
forming contacts on the top surfaces of the second regions of the fins;
wherein forming dummy gate structures comprises:
forming a layer of insulator overlying the fins and the insulating material;
depositing a layer of silicon germanium overlying the layer of insulator;
depositing a layer of hard mask material overlying the layer of silicon germanium;
patterning the layer of hard mask material, layer of silicon germanium, and layer of insulator to form dummy gate stacks; and
forming sidewall spacers on the dummy gate stacks.

14. The method of claim 13 further comprising providing a bulk silicon substrate, wherein etching trenches into a semiconductor substrate comprises etching trenches into the bulk silicon substrate.

15. The method of claim 13 further comprising epitaxially growing a layer of undoped silicon over the top surfaces of the fins.

16. The method of claim 13 further comprising:
   etching the top surfaces of the first regions of the fins exposed by removing the dummy gate structures to form recesses; and
   epitaxially growing a layer of undoped silicon to fill the recesses.

17. The method of claim 13 further comprising:
   etching stress-inducing trenches into the second regions of the fins between the dummy gate structures; and
   growing epitaxial material in the stress-inducing trenches, wherein covering the second regions of the fins with a fill material comprises depositing the fill material over the epitaxial material in the stress-inducing trenches.

18. The method of claim 13 further comprising:
   removing the dummy gate structures to expose the top surfaces of the first regions of the fins;
   etching the first regions of the fins to form channel trenches; and
   growing channel epitaxial material in the channel trenches, wherein forming a gate structure comprises forming a gate structure overlying the channel epitaxial material and sidewalls of the first regions of the fins.

* * * * *